US012666661B2

(12) United States Patent
Kwon et al.

(10) Patent No.: US 12,666,661 B2
(45) Date of Patent: Jun. 23, 2026

(54) SEMICONDUCTOR DEVICE HAVING GATE INSULATING LAYER IN TRENCH AND ON UPPER SURFACE OF SUBSTRATE, CHANNEL LAYER ON GATE INSULATING LAYER, AND SPACED-APART SOURCE AND DRAIN ELECTRODES ON CHANNEL LAYER

(71) Applicant: Samsung Electronics Co., Ltd., Suwon-si (KR)

(72) Inventors: Junyoung Kwon, Suwon-si (KR); Minsu Seol, Suwon-si (KR); Keunwook Shin, Suwon-si (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 559 days.

(21) Appl. No.: 18/153,633

(22) Filed: Jan. 12, 2023

(65) Prior Publication Data

US 2024/0014303 A1     Jan. 11, 2024

(30)     Foreign Application Priority Data

Jul. 11, 2022     (KR) ......................... 10-2022-0085277

(51) Int. Cl.
*H10D 48/36* (2025.01)
*H01L 21/02* (2006.01)
(Continued)

(52) U.S. Cl.
CPC ..... *H10D 48/362* (2025.01); *H01L 21/02568* (2013.01); *H01L 21/0262* (2013.01);
(Continued)

(58) Field of Classification Search
CPC ........... H10D 30/6728; H10D 30/6757; H10D 48/362; H10D 64/252; H10D 99/00; H01L 21/02568; H01L 21/0262
See application file for complete search history.

(56) References Cited

U.S. PATENT DOCUMENTS

| | | | |
|---|---|---|---|
| 7,795,144 B2 * | 9/2010 | Hirao | 438/679 |
| 7,968,674 B2 | 6/2011 | Choi et al. | |

(Continued)

FOREIGN PATENT DOCUMENTS

| | | |
|---|---|---|
| KR | 10-2007-0064163 A | 6/2007 |
| KR | 10-1045089 B1 | 6/2011 |

(Continued)

OTHER PUBLICATIONS

Korean Office Action dated Dec. 8, 2023 for corresponding Korean Application No. 10-2022-0085277, and English-language translation thereof.

*Primary Examiner* — Wael M Fahmy
*Assistant Examiner* — Alice W Tang
(74) *Attorney, Agent, or Firm* — Harness, Dickey & Pierce, P.L.C.

(57)     ABSTRACT

A semiconductor device includes a substrate including a gate electrode therein, a trench penetrating the gate electrode and arranged in the substrate, a gate insulating layer in the trench and an upper surface of the substrate, a channel layer on the gate insulating layer and including a two-dimensional (2D) semiconductor material, and a source electrode and a drain electrode, which are spaced apart from each other on the channel layer.

20 Claims, 16 Drawing Sheets

(51) Int. Cl.
　　*H10D 30/67*　　　　(2025.01)
　　*H10D 62/80*　　　　(2025.01)
　　*H10D 64/23*　　　　(2025.01)
　　*H10D 99/00*　　　　(2025.01)

(52) U.S. Cl.
　　CPC ..... *H10D 30/6728* (2025.01); *H10D 30/6757* (2025.01); *H10D 62/80* (2025.01); *H10D 64/252* (2025.01); *H10D 99/00* (2025.01)

(56)　　　　　　　References Cited

U.S. PATENT DOCUMENTS

| 7,988,941 | B2 | 8/2011 | Choi et al. |
| 8,133,466 | B2 | 3/2012 | Shin et al. |
| 8,283,038 | B2 | 10/2012 | Choi et al. |
| 8,535,553 | B2 | 9/2013 | Kong et al. |
| 8,623,761 | B2 | 1/2014 | Bonilla et al. |
| 8,723,024 | B2 | 5/2014 | Choi et al. |
| 8,895,433 | B2 | 11/2014 | Bonilla et al. |
| 8,906,787 | B2 | 12/2014 | Park et al. |
| 8,912,530 | B2 | 12/2014 | Yang et al. |
| 9,040,957 | B2 | 5/2015 | Lee et al. |
| 9,064,777 | B2 | 6/2015 | Heo et al. |
| 9,108,848 | B2 | 8/2015 | Woo et al. |
| 9,324,634 | B2 | 4/2016 | Bao et al. |
| 9,324,635 | B2 | 4/2016 | Bao et al. |
| 9,359,211 | B2 | 6/2016 | Woo et al. |
| 9,431,461 | B2 | 8/2016 | Park |
| 9,472,450 | B2 | 10/2016 | Bonilla et al. |
| 9,527,043 | B2 | 12/2016 | Choi et al. |
| 9,533,265 | B2 | 1/2017 | Choi et al. |
| 9,583,358 | B2 | 2/2017 | Kim et al. |
| 9,647,123 | B1 * | 5/2017 | Balakrishnan et al. ..................... H01L 29/78618 |
| 9,721,734 | B2 | 8/2017 | Ryu et al. |
| 10,325,987 | B2 | 6/2019 | Park et al. |
| 2010/0044797 | A1 | 2/2010 | Lee |
| 2011/0127471 | A1 | 6/2011 | Shin et al. |
| 2013/0059155 | A1 | 3/2013 | Choi et al. |
| 2014/0087191 | A1 | 3/2014 | Chua et al. |
| 2014/0291819 | A1 * | 10/2014 | Barth .................. H01L 23/5376 |
| 2015/0235959 | A1 | 8/2015 | Lee et al. |
| 2015/0279997 | A1 | 10/2015 | Koldiaev et al. |
| 2017/0162654 | A1 | 6/2017 | Maeda et al. |
| 2018/0182898 | A1 | 6/2018 | Moroz et al. |
| 2018/0240907 | A1 * | 8/2018 | Anderson et al. .. H01L 29/7827 |
| 2019/0074381 | A1 | 3/2019 | Park et al. |
| 2020/0044083 | A1 | 2/2020 | Tang et al. |
| 2020/0066917 | A1 | 2/2020 | Kula et al. |
| 2020/0373409 | A1 * | 11/2020 | Chen et al. ....... H01L 29/66469 |
| 2021/0242316 | A1 | 8/2021 | Yang et al. |
| 2022/0102495 | A1 | 3/2022 | Maxey et al. |
| 2022/0302318 | A1 | 9/2022 | Ramaswamy et al. |

FOREIGN PATENT DOCUMENTS

| KR | 10-2014-0106903 | A | 9/2014 |
| KR | 10-2017-0065070 | A | 6/2017 |
| KR | 10-2019-0026139 | A | 3/2019 |
| KR | 10-2021-0054019 | A | 5/2021 |
| WO | WO-2018/009931 | A1 | 1/2018 |

* cited by examiner

Substrate Formation

Trench Formation

Gate Insulating Layer Formation

Channel Layer Deposition

Hole size patterning

Contact metal evaporation

140

SEMICONDUCTOR DEVICE HAVING GATE INSULATING LAYER IN TRENCH AND ON UPPER SURFACE OF SUBSTRATE, CHANNEL LAYER ON GATE INSULATING LAYER, AND SPACED-APART SOURCE AND DRAIN ELECTRODES ON CHANNEL LAYER

CROSS-REFERENCE TO RELATED APPLICATION

This application is based on and claims priority under 35 U.S.C. § 119 to Korean Patent Application No. 10-2022-0085277, filed on Jul. 11, 2022, in the Korean Intellectual Property Office, the disclosure of which is incorporated by reference herein in its entirety.

BACKGROUND

1. Field

The inventive concepts relate to semiconductor devices including a trench structure and methods of manufacturing the semiconductor devices.

2. Description of the Related Art

According to the recent tendency to miniaturize semiconductor devices to increase a degree of integration, research using two-dimensional (2D) materials has been actively conducted. The 2D materials refer to crystalline materials in a couple of atomic layers and have been studied as a silicon alternative. Moreover, as the 2D materials show stable and excellent characteristics even in a nano-scale thickness, they have been widely used as a next-generation material, which may overcome the issue of performance degradation according the miniaturization of semiconductor devices.

In this connection, technologies regarding securement of contact area to lower the contact resistance of semiconductor devices based on the 2D materials as well as improvement of the degree of integration of the semiconductor devices have been studied.

SUMMARY

Provided are a semiconductor device including a trench and a method of manufacturing the semiconductor device.

Additional aspects will be set forth in part in the description which follows and, in part, will be apparent from the description, or may be learned by practice of the presented embodiments of the inventive concepts.

According to some example embodiments of the inventive concepts, a semiconductor device includes a substrate including a gate electrode therein, one or more inner surfaces of the substrate at least partially defining a trench penetrating the gate electrode and in the substrate, a gate insulating layer that is both in the trench and on an upper surface of the substrate, a channel layer on the gate insulating layer and including a two-dimensional (2D) semiconductor material, and a source electrode and a drain electrode, which are spaced apart from each other on the channel layer.

A width in a horizontal direction of an upper area of the trench that is proximate to the upper surface of the substrate may be different from a width in the horizontal direction of a lower area of the trench that is distal from the upper surface of the substrate, the horizontal direction extending parallel to the upper surface of the substrate.

A width of the trench in a horizontal direction extending parallel to the upper surface of the substrate may continuously change from a first width proximate to the upper surface of the substrate towards a second width proximate to an interior of the substrate in a vertical direction extending perpendicular to the upper surface of the substrate.

The width of the trench in a horizontal direction extending parallel to the upper surface of the substrate continuously increases from a first width proximate to the upper surface of the substrate towards a second width proximate to an interior of the substrate in a vertical direction extending perpendicular to the upper surface of the substrate.

An inclination angle of a wall of the trench to a central axis of the semiconductor device may be greater than 0° and less than or equal to 45°.

The source electrode may be in the trench and the drain electrode may be on the upper surface of the substrate.

A distance between the source electrode and the drain electrode in a horizontal direction parallel to the upper surface of the substrate may be smaller than a distance between the source electrode and the gate electrode in the horizontal direction.

The distance between the source electrode and the drain electrode in a horizontal direction parallel to the upper surface of the substrate may be 0 nm.

At least one of the source electrode or the drain electrode may have a central axis that is coaxial with a central axis of the semiconductor device so as to be symmetric with respect to the central axis of the semiconductor device.

The gate electrode may include a first gate electrode and a second gate electrode, which are spaced apart from each other, and the drain electrode may include a first drain electrode and a second drain electrode, which are on separate, respective areas of the upper surface of the substrate that at least partially overlap separate, respective ones of the first gate electrode and the gate second electrode in a vertical direction extending perpendicular to the upper surface of the substrate.

The 2D semiconductor material may include transition metal dichalcogenide (TMD).

The TMD may include a metallic element selected from Mo, W, Nb, V, Ta, Ti, Zr, Hf, Tc, Re, Cu, Ga, In, Sn, Ge, and Pb, and a chalcogen element selected from S, Se, and Te.

The gate electode may include at least one of graphene, amorphous carbon, Cu, Au, Ag, Mo, W, Ti, Al, Co, Ru, TiN, or indium tin oxide.

According to some example embodiments of the inventive concepts, a method of manufacturing a semiconductor device includes preparing a substrate including a gate electrode therein, forming, in the substrate, a trench at least partially defined by one or more inner surfaces of the substrate such that the trench penetrates the gate electrode, forming a gate insulating layer that is both in the trench and on an upper surface of the substrate, forming, on the gate insulating layer, a channel layer including a two-dimensional (2D) semiconductor material, and forming a source electrode and a drain electrode, which are spaced apart from each other on the channel layer.

The channel layer may be formed based on using a vapor deposition process.

The vapor deposition process may include at least one of metal organic chemical vapor deposition (MOCVD), thermal chemical vapor deposition (TCVD), plasma enhanced chemical vapor deposition (PECVD), or atomic layer deposition (ALD).

An inclination angle of a wall of the trench to a central axis of the semiconductor device may be greater than 0° and less than or equal to 45°.

The source electrode and the drain electrode may be formed by using physical vapor deposition (PVD).

A width in a horizontal direction of an upper area of the trench that is proximate to the upper surface of the substrate may be different from a width in the horizontal direction of a lower area of the trench that is distal from the upper surface of the substrate, the horizontal direction extending parallel to the upper surface of the substrate.

The 2D semiconductor material may include transition metal dichalcogenide (TMD).

BRIEF DESCRIPTION OF THE DRAWINGS

The above and other aspects, features, and advantages of certain embodiments of the inventive concepts will be more apparent from the following description taken in conjunction with the accompanying drawings, in which.

DETAILED DESCRIPTION

Figure 1:
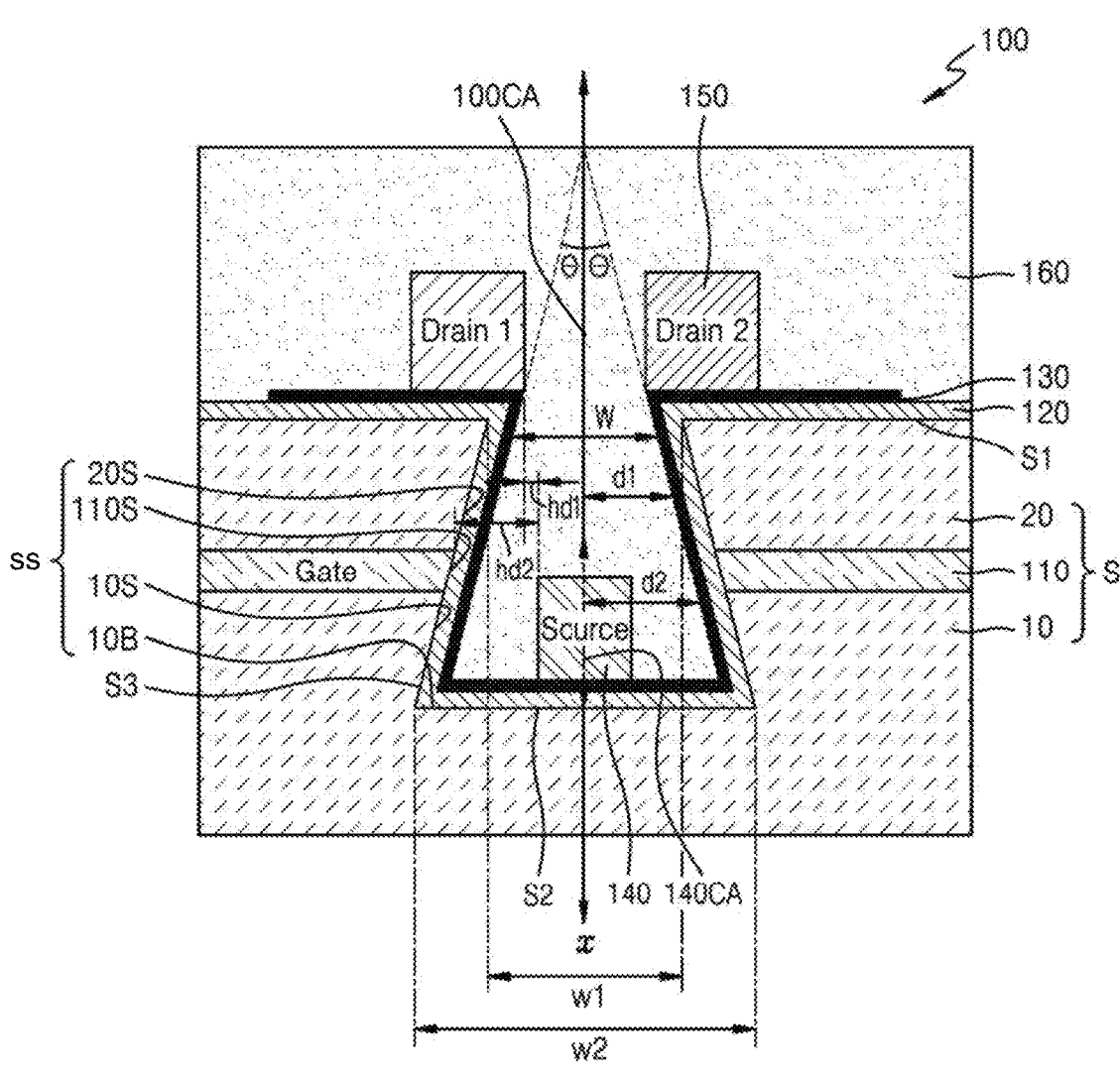
FIG. 1 is a cross-sectional view of a semiconductor device according to some example embodiments.

Reference will now be made in detail to example embodiments, some of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described in detail with reference to the accompanying drawings. In the drawings, like reference numerals in the drawings denote like elements, and sizes of components in the drawings may be exaggerated for clarity and convenience of explanation. Meanwhile, some example embodiments described below are provided only as an example, and thus can be embodied in various forms.

It will be understood that when a component is referred to as being "on" or "over" another component, the component can be directly on, under, on the left of, or on the right of the other component, or can be on, under, on the left of, or on the right of the other component in a non-contact manner. An expression used in the singular encompasses the expression of the plural, unless it has a clearly different meaning in the context. When a portion "includes" an element, another element may be further included, rather than excluding the existence of the other element, unless otherwise described.

The use of the terms "a" and "an" and "the" and similar referents in the context of describing embodiments (especially in the context of the following claims) are to be construed to cover both the singular and the plural. The operations of all methods described herein can be performed in any suitable order unless otherwise indicated herein or otherwise clearly contradicted by context, and embodiments are not limited to the described order of the operations.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

The connecting lines, or connectors shown in the various figures presented are intended to represent example functional relationships and/or physical or logical couplings between the various elements, and thus it should be noted that many alternative or additional functional relationships, physical connections or logical connections may be present in a practical device.

The use of any and all examples, or example language provided herein, is intended merely to better illuminate technical ideas and does not pose a limitation on the scope of embodiments unless otherwise claimed.

Figure 2:
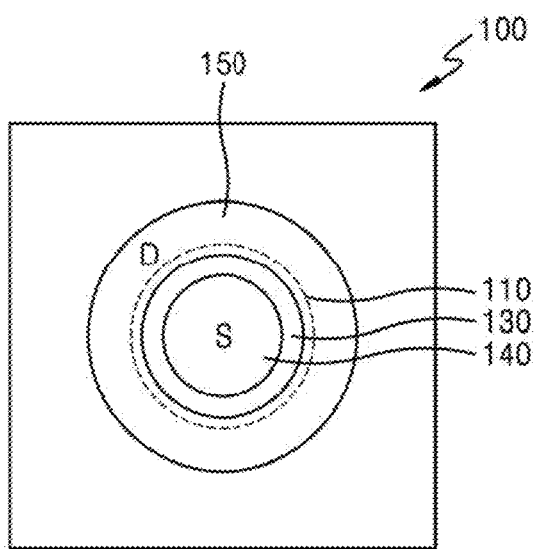
FIG. 2 is a plan view of the semiconductor device of FIG. 1 according to some example embodiments.

FIG. 1 is a cross-sectional view of a semiconductor device according to some example embodiments, and FIG. 2 is a plan view of the semiconductor device of FIG. 1. A semiconductor device 100 illustrated in FIGS. 1 and 2 may be, for example, a field effect transistor (FET).

With reference to FIGS. 1 and 2, the semiconductor device 100 according to some example embodiments may include a substrate S including a gate electrode 110 therein (e.g., within a volume space at least partially defined by outermost surfaces of the substrate S, including the upper surface S1 thereof), a trench T penetrating the gate electrode 110 and arranged in the substrate S, a gate insulating layer 120 arranged in the trench T and an upper surface S1 of the substrate S, a channel layer 130 arranged on the gate insulating layer 120, and a source electrode 140 and a drain electrode 150, which are arranged apart from each other on the channel layer 130.

The substrate S may include a first insulating layer 10 and a second insulating layer 20, and the gate electrode 110 may be arranged between the first insulating layer 10 and the second insulating layer 20. The gate electrode 110 may include, for example, electrically conductive metals, such as gold, silver, aluminum, etc., electrically conductive metal oxides, or electrically conductive metal nitrides. In addition, the gate electrode 110 may include at least one of graphene, amorphous carbon, Cu, Au, Ag, Mo, W, Ti, Al, Co, Ru, TiN, or indium tin oxide; however, the inventive concepts are not limited thereto.

The first insulating layer 10 and the second insulating layer 20 may be formed of the same material or different materials. For example, the first insulating layer 10 and the second insulating layer 20 may include an oxide. However, the inventive concepts are not limited thereto.

The gate electrode 110 may have a thickness greater than 0 nm and less than or equal to 30 nm. However, the foregoing is provided only as an example.

As the gate electrode 110 is arranged parallel with the upper surface S1 of the substrate S, it is unnecessary to perform a separate process of measuring a length of the gate electrode 110 to manufacture the semiconductor device 100 according to some example embodiments. That is, the semiconductor device 100 may be manufactured at a low cost.

The trench T may penetrate the gate electrode 110 and be arranged in the substrate S. The trench T may be formed by etching the substrate S. The etching process of the trench T is to be explained in the description of a method of manufacturing a semiconductor device.

As shown in FIG. 1, the trench T may be understood to be at least partially defined by one or more inner surfaces SS of the substrate S. The one or more inner surfaces SS of the substrate SS may include an inner sidewall surface 20S of the second insulating layer 20, an inner sidewall surface 110S of the gate electrode 110, an inner sidewall surface 10S of the first insulating layer 10, and an upward-facing floor surface 10B of the first insulating layer 10. As shown, the one or more inner surfaces SS of the substrate S may at least partially define the trench T as a structure that extends from the upper surface S1 of the substrate S into an interior of the substrate S (which may be understood to a region within a volume space defined by outermost surfaces of the substrate S such as the upper surface S1) so as to penetrate the gate electrode 110 so that the gate electrode 110 includes one or more inner sidewall surfaces 110S which may oppose each other across the trench T.

The trench T may include a bottom surface S2 (at least partially defined by the floor surface 10B) extending in horizontal direction that is parallel with the upper surface S1 of the substrate S and a wall inclined in a thickness direction of the substrate S (e.g., a vertical direction that is perpendicular to the upper surface S1 of the substrate S). An inclination angle θ of a wall S3 of the trench T (which may be at least partially defined by the inner sidewall surfaces 20S, 110S, and 10S) to a central axis 100CA of the semiconductor device 100 and/or of the trench T may be greater than 0° and less than 90°. Alternatively, the inclination angle θ of the wall S3 of the trench T to the central axis of the semiconductor device 100 may be greater than 0° and less than or equal to 45°.

As described herein, a horizontal direction may be understood to be a direction that extends parallel to the upper surface S1 of the substrate S, and a vertical direction (also referred to as a thickness direction of the substrate S) may be understood to be a direction that extends perpendicular to the upper surface S1 of the substrate S.

In FIG. 1, the X axis (central axis) is illustrated to describe inclination of the semiconductor device 100.

The wall S3 of the trench T of the semiconductor device 100 according to some example embodiments may have a certain inclination angle θ in a direction penetrating the gate electrode 110, i.e., with respect to the X axis (central axis). When the direction vertically penetrating the gate electrode 110 is set as the X axis (central axis, such as the central axis 100CA, which may be a central axis of the semiconductor device 100, which may additionally or alternatively be a central axis of the trench T), the inclination angle θ refers to the inclination of the wall S3 of the trench T with respect to the X axis. In the process of forming the trench T, the etching process may be performed on the substrate S, and such an etching process may include a photolithography process, a plasma etching process, and a wet etching process. The inclination angle θ of the wall S3 of the trench T may be changed according to an intensity or degree of the etching performed during the etching process.

The inclination angle θ of the wall S3 of the trench T to the central axis of the semiconductor device 100 may be greater than 0° and less than or equal to 45°. As the inclination angle θ of the wall S3 of the trench T is greater than 0° and less than or equal to 45°, a width d1 of an upper portion of the trench T of the semiconductor device 100, which may be referred to as a first width in the horizontal direction of an upper area of the trench T that is proximate to the upper surface S1 of the substrate S in the vertical direction, may be different from (e.g., smaller than or greater than) a width d2 of a lower portion of the trench T of the semiconductor device 100, which may be referred to as a second width in the horizontal direction of an lower area of the trench T that is distal from the upper surface S1 of the substrate S in the vertical direction. Restated, the width of a given cross-section of the trench T in the horizontal direction may vary with distance of the given cross-section of the trench T from the upper surface S1 of the substrate S in the vertical direction (e.g., depth of the given cross-section). In addition, due to the wall S3 of the trench T having the inclination angle θ, the drain electrode 150 may be deposited only on an exposed portion of the bottom surface of the trench T (e.g., an exposed portion of the bottom surface S2, at least partially defined by the floor surface 10B, which is exposed in the vertical direction from, and thus does not overlap in the vertical direction with the wall S3, upper surface S1, and/or any other part of the substrate S), and no electrode may be deposited on a lateral surface of the trench T on which the channel layer 130 including a two-dimensional (2D) material is arranged. As seen from the top of the semiconductor device 100, the source electrode 140 and the drain electrode 150 may be sequentially connected to each other. That is, a distance between the source electrode 140 and the drain electrode 150 (e.g., in the horizontal direction) may substantially be 0 (e.g., 0 mm, 0 nm, etc.). Accordingly, a highly integrated semiconductor device described above may be formed. A specific manufacturing method of the semiconductor device is to be described below.

A cross-section of the trench T according to some example embodiments (e.g., in a plan view as shown in FIG. 2) may have a circular shape. However, the inventive concepts are not limited thereto. The shape of the cross-section of the trench T (e.g., in a plan view as shown in FIG. 2) may include an oval shape, a tetragonal shape, a pentagonal shape, or at least one of polygonal shapes.

A width (e.g., width in the horizontal direction) of an upper area of the trench T that is proximate to the upper surface S1 of the substrate S according to some example embodiments may be different from a width (e.g., width in the horizontal direction) of a lower area of the trench T that is distal from the upper surface S1 of the substrate S. For example, the width of the upper area of the trench T may a first width w1 that may be smaller than the width of the lower area of the trench T which may be a second width w2. Restated, the width of a given cross-section of the trench T in the horizontal direction may vary with distance of the given cross-section of the trench T from the upper surface S1 of the substrate S in the vertical direction (e.g., depth of the given cross-section from the upper surface S1). Moreover, a width w of the trench T may gradually (e.g., continuously, without step changes) change from the upper surface S1 of the substrate S towards the inside (e.g., interior) of the substrate S (e.g., the width of the trench T in the horizontal direction may continuously change in the vertical direction. Restated, the width of a given cross-section of the trench T in the horizontal direction may vary continuously, without step changes, with distance of the given cross-section of the trench T from the upper surface S1 of the substrate S in the vertical direction (e.g., depth of the given cross-section). For example, the width w of the trench T may gradually increase from a first width w1 proximate to (e.g., at) the upper surface S1 of the substrate S towards the inside of the substrate S (e.g., towards a second width w2 proximate to, or at, the interior of the substate S such as at the bottom surface S2 of the trench T). Restated, the width of a given cross-section of the trench T in the horizontal direction may be proportional (e.g., directly proportional) to distance of the given cross-section of the trench T from the upper surface S1 of the substrate S in the vertical direction (e.g., proportional to depth of the given cross-section) such that there is no step-change in the width of the trench T along the depth of the trench T from the upper surface S1 of the substrate S. For example, the width of a given cross-section of the trench T in the horizontal direction may be defined by a mathematical algorithm (e.g., a linear algorithm) where the width is a function of the distance of the given cross-section of the trench T from the upper surface S1 of the substrate S in the vertical direction (e.g., proportional to depth of the given cross-section), such that there is no step-change in the width of the trench T along the depth of the trench T from the upper surface S1 of the substrate S. In some example embodiments, the width in the horizontal direction of the trench T may vary continuously along the depth of the trench T from the upper surface of the substrate S1 according to mathematical algorithm that is different from a linear function as illustrated in FIG. 1 (e.g., vary non-linearly with depth), such that the inclination angle of the wall S3 at a given cross-section of the trench T in the horizontal direction may vary based on the depth of the given cross section of the trench from the upper surface S1 in the vertical direction. For example, the width in the horizontal direction of the trench T may vary continuously along the depth of the trench T from the upper surface of the substrate S1 according to mathematical algorithm which defines the width as a polynomial function of the depth, an exponential function of the depth, or the like.

The gate insulating layer 120 may be arranged both in (e.g., within) the trench T (e.g., on one or both of the wall S3 and the bottom surface S2) and the upper surface S1 of the substrate S. For example, the gate insulating layer 120 may extend continuously between the upper surface S1 of the substrate S, one or more walls S3 of the trench T, and the bottom surface S2 of the trench T.

An oxide used for the gate insulating layer 120 may include a high-k oxide. The gate insulating layer 120 may be deposited by, for example, an atomic layer deposition process.

The gate insulating layer 120 may include at least one of a high-k oxide, a silicon oxide, or a 2D insulating material, which may be used for the ALD process. The gate insulating layer 120 may include, for example, an aluminum oxide, a hafnium oxide, a zirconium oxide, a lanthanum oxide, etc. as the high-k material. The gate insulating layer 120 may include, for example, h-BN as the 2D insulating material. However, example embodiments are not limited thereto.

The structure or shape of the gate insulating layer 120 may be changed according to the structure or shape of the trench T. The structure, shape, and inclination angle of the gate insulating layer 120 may be changed according to the degree and intensity of the etching performed on the substrate S.

The channel layer 130 may be arranged on (e.g., directly or indirectly on) the gate insulating layer 120. The channel layer 130 may be arranged in correspondence with the gate insulating layer 120. For example, the channel layer 130 may extend to the upper surface S1 of the substrate S along (e.g., continuously along and/or over) the wall S3 and the bottom surface S2 of the trench T.

As the channel layer 130 extends into the trench T and further to the upper surface S1 of the substrate S, the length of the channel layer 130 may be shortened in a direction parallel with the upper surface S1 of the substrate S (e.g., the horizontal direction). In other words, when seen from the top of the semiconductor device 100, the length of the channel layer 130 (which may be the length of the channel layer 130 in the horizontal direction) may appear to be shortened.

The channel layer 130 may include a 2D semiconductor material. The 2D semiconductor material refers to a material which has a structure in which constituent atoms are combined in a 2D manner and show characteristics of a semiconductor. The 2D semiconductor material may include transition metal dichalcogenide (TMD).

The TMD is a compound of a transition metal and a chalcogen element. The transition metal may be selected from, for example, Mo, W, Nb, V, Ta, Ti, Zr, Hf, Tc, Re, Cu, Ga, In, Sn, Ge, and Pb, and the chalcogen element may be selected from S, Se, and Te. Specifically, the channel layer 130 including the 2D semiconductor material may include $MoS_2$, $WS_2$, $MoSe_2$, $WSe_2$, etc. However, this is only an example.

More specifically, the TMD included in the 2D semiconductor material may include $MoS_2$, $WS_2$, $MoSe_2$, $Wse_2$, $MoTe_2$, $Wte_2$, $ReS_2$, $ReSe_2$, $NbS_2$, $NbSe_2$, $PtS_2$, $PtSe_2$, $SnS_2$, $SnSe_2$, $ZrS_2$, $ZrSe_2$, $CuS_2$, $CuSe_2$, $FeS_2$, and $FeSe_2$, and further include a 2D monoatomic material such as phosphorene, graphene, tellurene, silicene, and germanene. However, the foregoing is provided only as an example.

When the channel layer 130 is formed of (e.g., comprises) silicon (Si), not only the mobility of electrons may decrease but also the dispersion of the threshold voltage may increase as the thickness of the channel is reduced. Also, as the length of the channel decreases, which leads to the short channel effect, the degradation of performance may be accelerated, thereby posing a limitation in the scale-down. On the contrary, when the channel layer 130 is formed of a 2D semiconductor material, the channel layer 130 having a nano-scale thickness may have excellent performance, and further, as the short channel effect may not apply as much as it applies to a silicon channel, the limitation in the scale-down may be overcome, thereby enabling further integration and improved compactness (e.g., improved miniaturization, size efficiency, etc.) of the semiconductor device 100 with reduced, minimized, or prevented degradation in semiconductor device 100 performance based on the reduced length of the channel layer 130 in the horizontal direction while the total length of the channel layer 130 (e.g., on the upper surface S1, wall S3, and bottom surface S3) is greater than the length of the channel layer 130 in the horizontal direction as a result of the channel layer 130 extending on the gate insulating layer 120 both in the trench T (e.g., where the trench may be structured by the inner surfaces SS of the substate S to have widths in the horizontal direction which vary in the vertical direction to further cause the total length of the channel layer 130 to be increased over the length of the channel layer 130 in the horizontal direction) and on the upper surface S1 of the substrate S.

The channel layer 130 including the 2D semiconductor material may have a thickness greater than 0 nm and less than or equal to 5 nm. However, the foregoing is provided only as an example.

The formation of the channel layer 130 may include a chemical vapor deposition process, which is to be explained in the description of the method of manufacturing a semiconductor device.

The source electrode 140 and the drain electrode 150, which are apart from each other (e.g., spaced apart from each other, also described as being isolated from direct contact with each other) may be arranged on the channel layer 130. An encapsulation layer, which may be an insulating layer 160, may be arranged on the exposed portions of the source electrode 140, drain electrode 150, channel layer 130, gate insulation layer 120, and/or substrate S. The insulating layer 160 may include at least one of a high-k oxide, a silicon oxide, or a 2D insulating material, which may be used for an ALD process. The insulating layer 160 may include, for example, an aluminum oxide, a hafnium oxide, a zirconium oxide, a lanthanum oxide, etc. as the high-k material. The insulating layer 160 may include, for example, h-BN as the 2D insulating material.

The source electrode 140 may be arranged in the trench T (e.g., on the bottom surface S2 of the trench T as shown in FIG. 2), and the drain electrode 150 may be arranged on the upper surface S1 of the substrate S. The source electrode 140 and/or the drain electrode 150 may be arranged symmetrically with respect to the central axis of the semiconductor device 100. For example, as shown in FIG. 2, a central axis 140CA of the source electrode 140 may be coaxial with the central axis 100CA, which may be a central axis of the semiconductor device 100 and/or a central axis of the trench T, such that the source electrode 140 may be understood to be symmetric with respect to the central axis 100CA of the semiconductor device 100 and/or of the trench T. In another example, a central axis of the drain electrode 150 may be coaxial with the central axis 100CA of the semiconductor device 100 and/or of the trench T, such that the drain electrode 150 may be understood to be symmetric with respect to the central axis 100CA of the semiconductor device 100 and/or of the trench T. However, the inventive concepts are not limited thereto.

As shown in FIG. 2, the source electrode 140 and the drain electrode 150 may be arranged in a direction parallel with the upper surface S1 of the substrate S (e.g., the source electrode 140 and the drain electrode 150 may be aligned in the horizontal direction when viewed in the plan view as shown in FIG. 2), the source electrode 140 may be arranged below the gate electrode 110 (e.g., in the vertical direction), and the drain electrode 150 may be arranged above the gate electrode 110 (e.g., in the vertical direction).

A distance between the source electrode 140 and the drain electrode 150, which are arranged in the direction parallel with the upper surface S1 of the substrate S (e.g., the horizontal direction), may be less than a distance between the source electrode 140 and the gate electrode 110 arranged in the direction parallel with the upper surface S1 of the substrate S. For example, the distance (e.g., smallest distance) between the source electrode 140 and the drain electrode 150 in the horizontal direction (e.g., hd1) may be smaller than the distance (e.g., smallest distance) between the source electrode 140 and the gate electrode 110 in the horizontal direction (e.g., hd2). In some example embodiments, the distance (e.g., smallest distance) between the source electrode 140 and the drain electrode 150 in the horizontal direction (e.g., hd1) may be 0 (e.g., 0 nm), although the total distance between the source electrode 140 and the drain electrode 150 (e.g., in the vertical direction) may be greater than 0 (e.g., greater than 0 nm) such that the source electrode 140 and the drain electrode 150 are spaced apart from each other.

The source electrode 140 and the drain electrode 150 may be formed by (e.g., based on) physical vapor deposition (PVD), and given the strong straightness of the PVD, the distance between the source electrode 140 and the drain electrode 150 in the direction parallel with the upper surface S1 of the substrate S may substantially be (e.g., 0 nm, 0 mm, etc.). For example, the distance between the source electrode 140 and the drain electrode 150 in the horizontal direction (e.g., hd1) may be 0 (e.g., nm).

The source electrode 140 and the drain electrode 150 may include a metallic material including a conductive material. However, the inventive concepts are not limited thereto.

FIGS. 1 and 2 illustrate that the source electrode 140 is arranged in the trench T, and the drain electrode 150 is arranged on the upper surface S1 of the substrate S; however, the inventive concepts are not limited thereto. The drain electrode 150 may be arranged in the trench T, and the source electrode 140 may be arranged on the upper surface S1 of the substrate S.

A semiconductor device including a 2D semiconductor material may be configured to reduce contact resistance with an electrode, and to achieve reduced contact resistance, and thus may be configured to have a wide contact area. Accordingly, to implement the performance of existing silicon-based semiconductor devices, a contact area or a contact length may be increased, which leads to an increased overall length of the semiconductor devices, and thus, manufacturing of highly integrated semiconductor devices may become unachievable.

In the semiconductor device 100 according to some example embodiments, the trench T may be formed in the substrate S including the gate electrode 110 and the channel layer 130 may be arranged on the bottom surface S2 and the wall S3 of the trench T and the upper surface S1 of the substrate S to secure sufficient length of the channel layer 130 to implement good semiconductor device performance based on to sufficient contact area. Moreover, as the channel layer 130 is bent at least one time by the trench T, the length of the channel may be shortened in the direction parallel with the upper surface S1 of the substrate S (e.g., the horizontal direction). As the source electrode 140 is arranged on the bottom surface S2 of the trench T, and the drain electrode 150 is arranged on the upper surface S1 of the substrate S, the overall (e.g., total) length of the channel layer 130 between the source electrode 140 and the drain electrode 150 may be maintained while a horizontal length of the channel layer 130 between the source electrode 140 and the drain electrode 150 (i.e., the length of the channel in the horizontal direction parallel with the upper surface S1 of the substrate S) is shortened. Accordingly, the length of the channel in the horizontal direction parallel with the upper surface S1 of the substrate S is shortened, and the degree of integration of the semiconductor device may be increased.

As the length of the channel is secured sufficiently by the trench T, the contact area between the channel layer 130 and the source electrode 140 and the contact area between the channel layer 130 and the drain electrode 150 may also be secured.

Due to the overall length of the channel layer 130 (enabled based on the channel layer 130 extending over both the upper surface S1 and the wall(s) S3 and bottom surface S2 of the trench T, within the trench T), a sufficient current in the semiconductor device may be delivered, thereby enabling improved performance of a miniaturized semiconductor device 100.

Hereinafter, the method of manufacturing the semiconductor device 100 is described. FIGS. 3A, 3B, 3C, 3D, 3E, 3F, 3G, and 3H are referential diagrams illustrating a method of manufacturing a semiconductor device, according to some example embodiments.

Figure 3A:
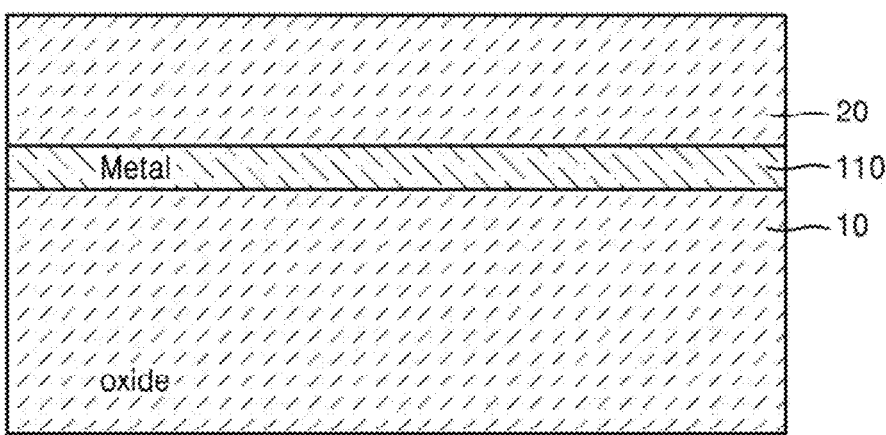
FIGS. 3A, 3B, 3C, 3D, 3E, 3F, 3G, and 3H are referential diagrams illustrating a method of manufacturing a semiconductor device, according to some example embodiments.

With reference to FIG. 3A, a substrate in which the gate electrode 110 is arranged between the first insulating layer 10 and the second insulating layer 20 may be formed. That is, the gate electrode 110 may be included in the substrate. The gate electrode 110 may include a conductive material. For example, the gate electrode 110 may include at least one of graphene, amorphous carbon, Cu, Au, Ag, Mo, W, Ti, Al, Co, Ru, TiN, or indium tin oxide. However, the foregoing is provided only as an example.

Figure 3B:
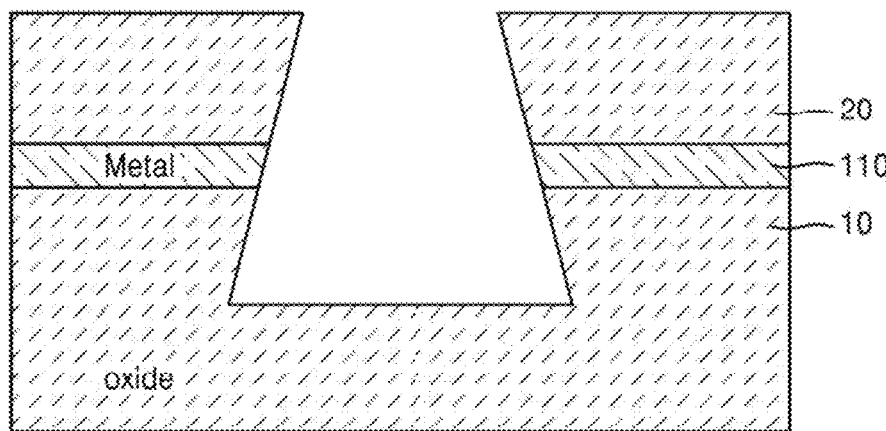

With reference to FIG. 3B, a trench may be formed penetrating the gate electrode 110 arranged in the substrate. The substrate in which the gate electrode 110 including a conductive material is placed between the first insulating layer 10 and the second insulating layer 20 may be arranged. Then, by etching the substrate using a combined process of a precise photolithography process, a plasma etching process, and a wet etching process, a semiconductor device including a trench with a wall having an inclination angle greater than 0° and less than or equal to 45° may be formed. Such a trench as formed in FIG. 3B, and as also shown in FIG. 1, may be referred to as a trench having a negative slope, and the formation of the trench in FIG. 3B may be referred to as negative slope trench etching.

Figure 3C:
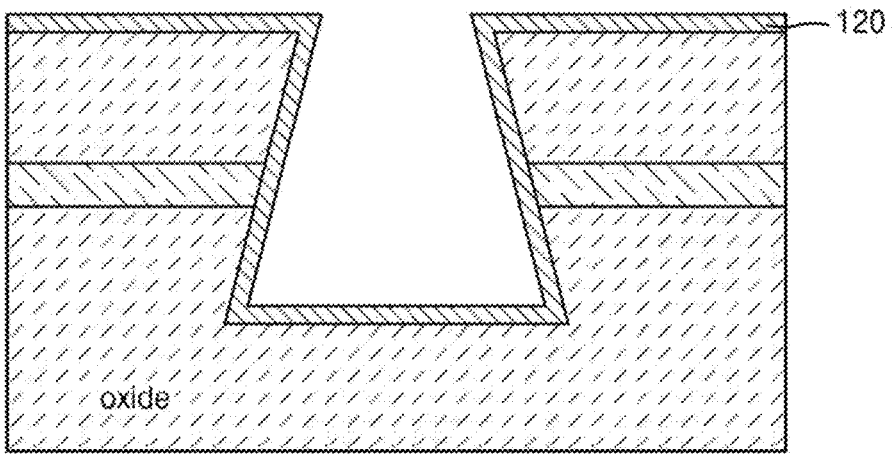

With reference to FIG. 3C, the gate insulating layer 120 may be formed in the trench formed in the substrate by etching. The gate insulating layer 120 may be formed along the trench. The gate insulating layer 120 may include, for example, $SiO_2$ or $Si_3N_4$; however, this is just an example. Accordingly, the gate insulating layer 120 formation shown in FIG. 3C may be referred to in some example embodiments as a dielectric coating operation.

Figure 3D:
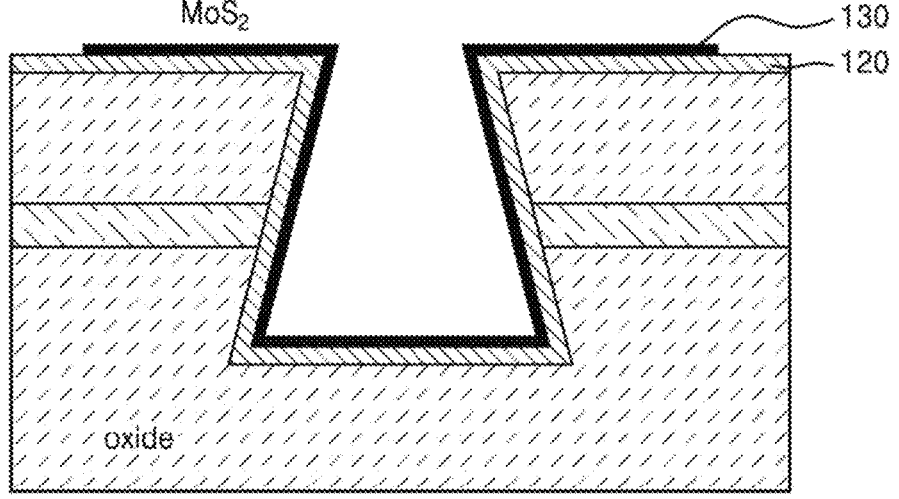
Figure 3E:
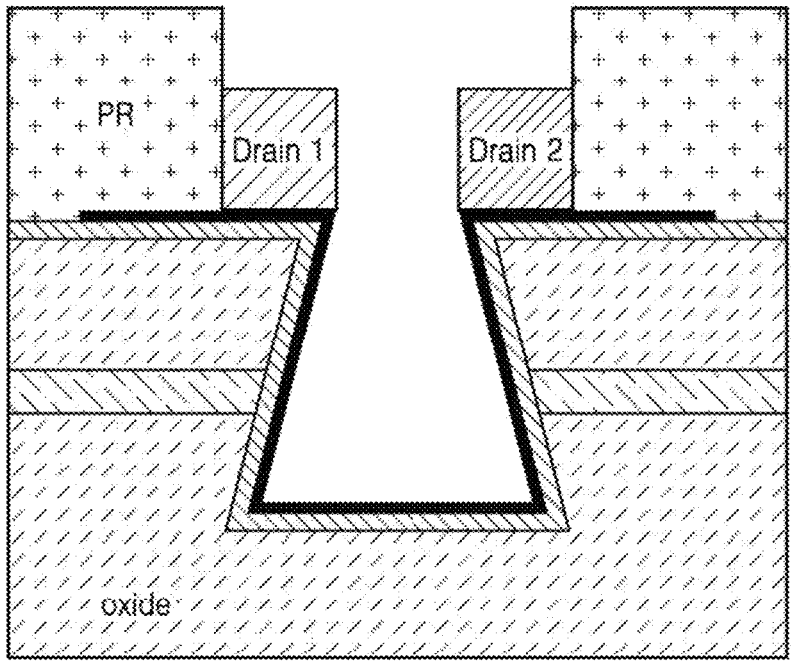
Figure 3F:
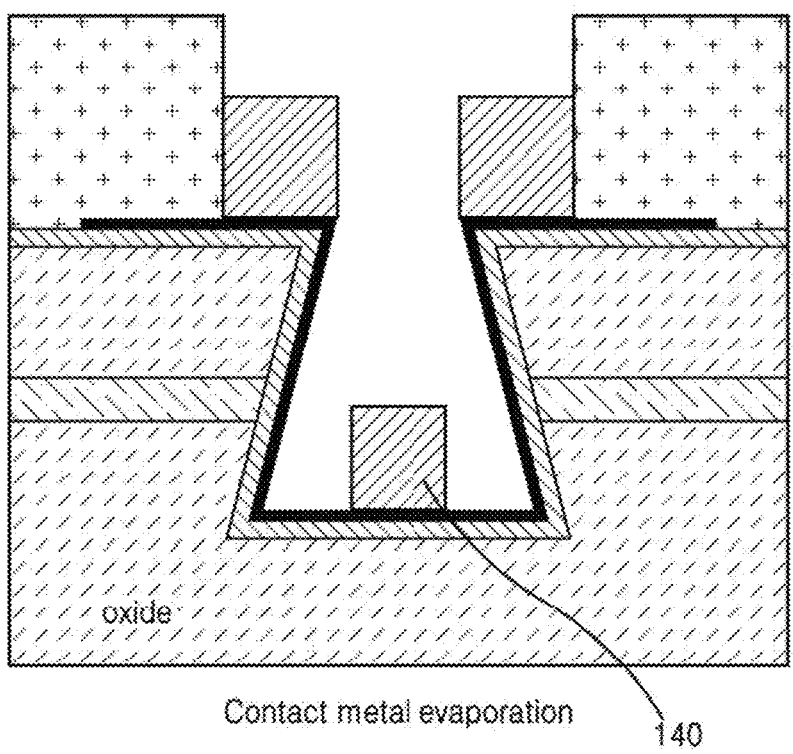

With reference to FIG. 3D, the channel layer 130 including a 2D semiconductor material may be formed (e.g., deposited) on the gate insulating layer 120 formed in the trench. The channel layer 130 may be formed starting from the surface of the substrate and extend into the substrate. The channel layer 130 may be formed by a vapor deposition process. Specifically, the vapor deposition process may include at least one of metal organic chemical vapor deposition (MOCVD), thermal chemical vapor deposition (TCVD), plasma enhanced chemical vapor deposition (PECVD), or atomic layer deposition (ALD). However, the foregoing is provided only as an example.

The channel layer 130 including the 2D semiconductor material may be formed along the wall of the trench having the inclination angle. Although the wall of the trench has the inclination angle or a certain gradient, as the channel layer 130 is formed by a vapor deposition process, the channel layer 130 may be formed along the wall having the inclination angle.

Specifically, the vapor deposition process is a type of chemical vapor deposition process in which source gases having a great chemical reactivity are carried and supplied by a carrier gas having no chemical reactivity, and by receiving energy from high heat, plasma, etc., a chemical reaction is induced near a substrate. The vapor deposition process shows higher deposition speed than other chemical deposition methods, such as ALD or physical deposition methods, such as a molecular beam deposition method. In addition, as the vapor deposition process has somewhat low straightness, it may be easy to deposit a target material on a bent or inclined surface.

As shown, the channel layer 130 may include $MoS_2$, but example embodiments are not limited thereto. The 2D semiconductor material constituting the channel layer 130 may include a TMD. The TMD may include a metallic element selected from Mo, W, Nb, V, Ta, Ti, Zr, Hf, Tc, Re, Cu, Ga, In, Sn, Ge, and Pb, and a chalcogen element selected from S, Se, and Te; however, this is just an example.

More specifically, the TMD included in the 2D semiconductor material may include $MoS_2$, $WS_2$, $MoSe_2$, $WSe_2$, $MoTe_2$, $WTe_2$, $ReS_2$, $ReSe_2$, $NbS_2$, $NbSe_2$, $PtS_2$, $PtSe_2$, $SnS_2$, $SnSe_2$, $ZrS_2$, $ZrSe_2$, $CuS_2$, $CuSe_2$, $FeS_2$, and $FeSe_2$, and further include a 2D monoatomic material, such as phosphorene, graphene, tellurene, silicene, and germanene. However, the foregoing is provided only as an example.

The channel layer 130 including the 2D semiconductor material may have a thickness greater than 0 nm and less than or equal to 5 nm. However, the foregoing is provided only as an example.

With reference to FIGS. 3E, 3F, 3G, and 3H, by (e.g., based on) arranging a photoresist PR in a slightly larger pattern than the trench formed in the substrate and performing the photolithography process using the photoresist PR, an area on which a source electrode and a drain electrode are to be deposited may be formed on the channel layer 130. Additionally, an insulating layer 160 may be formed on exposed portions of the source electrode, the drain electrode, the channel layer, the gate insulating layer and/or the substrate S. The insulating layer 160 may include, for example, $SiO_2$ or $Si_3N_4$; however, this is just an example.

The source electrode 140 and the drain electrode 150 may be formed by PVD. The PVD refers to a deposition process in which a metal and a target material are formed and deposited on a substrate or a wafer by using physical force, such as heat, electrons, etc. Compared to a chemical vapor deposition (CVD) method, the PVD method shows greater straightness and allows deposition of target materials without heating the materials.

In the method of manufacturing a semiconductor device, according to some example embodiments, when a source electrode and a drain electrode are deposited on the channel layer 130 by PVD, a target material, i.e., the source electrode and the drain electrode, may not be deposited on the wall of the trench having an inclination angle or a certain gradient. This is due to the strong straightness of the PVD. After the source electrode and the drain electrode are deposited in the trench and on the upper surface of the substrate, respectively, and then a lift-off process illustrated in FIG. 3G is performed, the source electrode may be arranged on an exposed portion of a bottom of the trench, and the drain electrode may be formed on the upper surface of the substrate.

Figure 3G:
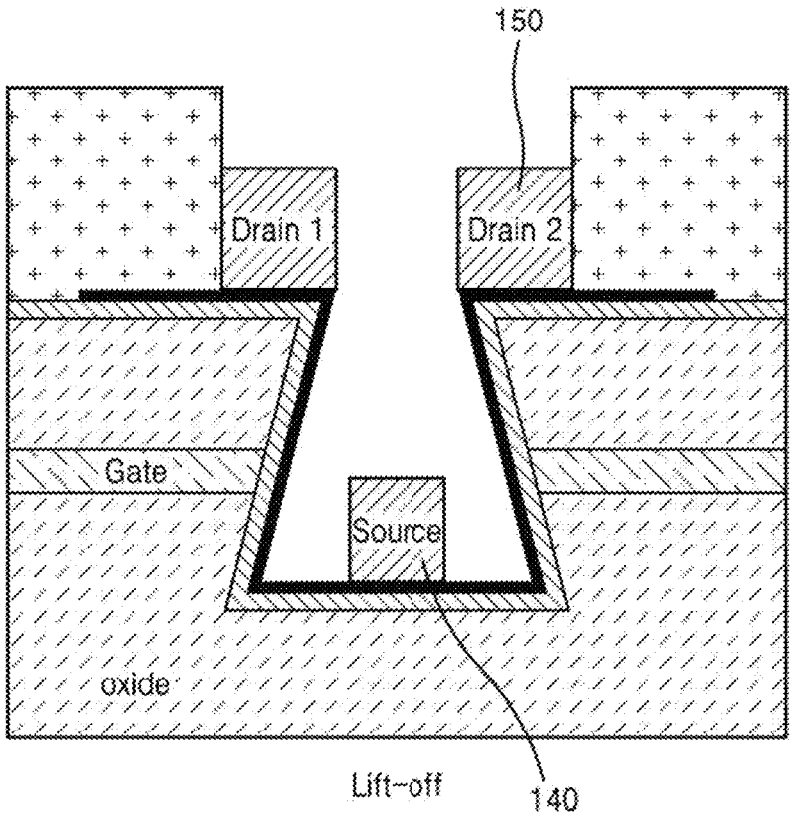
Figure 3H:
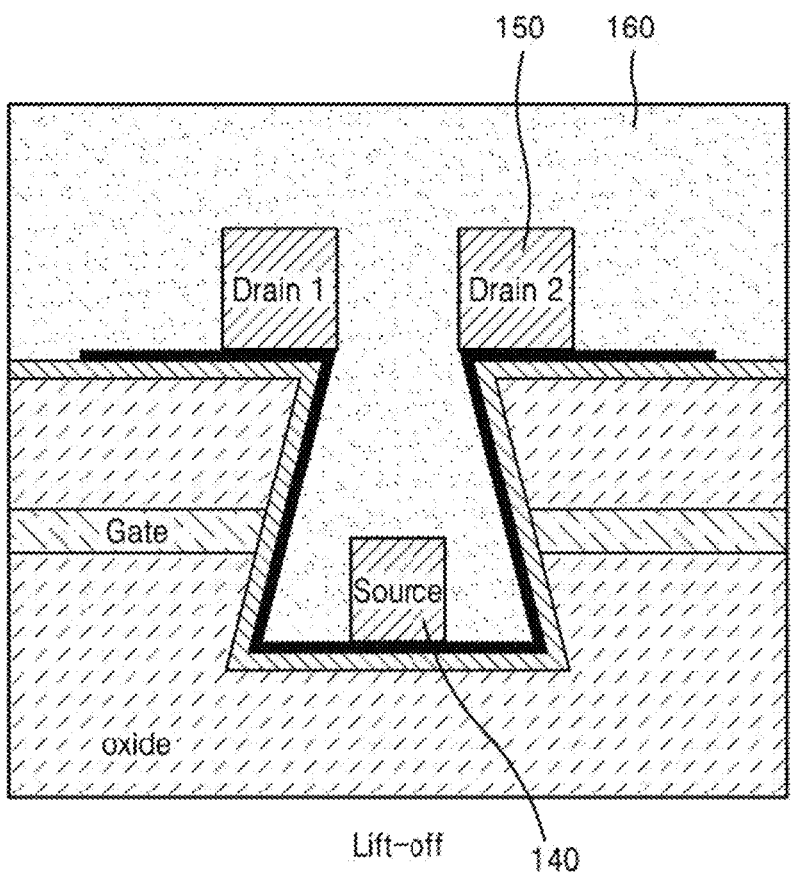

With reference to FIGS. 3G and 3H, the drain electrode 150 of the semiconductor device according to some example embodiments may include a first drain electrode 150a and a second drain electrode 150b, with the trench arranged therebetween.

As described above, according to the arrangement structure of the source electrode 140 and the drain electrode 150 of the semiconductor device 100, from the top view, the length of the channel may be reduced, and due to such a reduction in the length of the channel in the horizontal direction, the length of contact in the semiconductor device 100 may be increased and/or the overall length of the semiconductor device 100 (e.g., in the horizontal direction) may be reduced to increase the degree of integration of the semiconductor device 100.

In addition, as the channel layer 130 including the 2D semiconductor material may be formed on the entire wall of the trench (e.g., over wall(s) S3 and bottom surface S2) of the semiconductor device according to some example embodiments, a sufficient channel length (e.g., total length of the channel layer 130, which includes a total distance along the channel layer 130 between two opposite endpoints of the channel layer 130) may be secured. Due to the sufficient length of the channel, a sufficient current in the semiconductor device may be secured. When a sufficient current is secured in the semiconductor device, a plurality of devices may be formed by using one source electrode. This allows formation of a semiconductor device having a higher density per unit area.

The drain electrode 150 of the semiconductor device according to some example embodiments may include a first drain electrode 150a and a second drain electrode 150b, with the trench arranged therebetween. The first drain electrode 150a and the second drain electrode 150b are used to describe a plurality of drain electrodes, and the drain electrode 150 may further include a third drain electrode 150c, a fourth drain electrode 150d, etc. However, the foregoing is provided only as an example.

That is, the plurality of drain electrodes may be connected with one source electrode 140. As there is no need to form a drain electrode to each correspond to a separate, respective source electrode (e.g., such that a plurality of source electrodes are provided to correspond to separate, respective drain electrodes), a highly integrated semiconductor device may be manufactured. Moreover, a plurality of channel layers may be formed to connect the plurality of drain electrodes with one trench, and a plurality of semiconductor devices may be formed.

The shape of the semiconductor device 100 according to some example embodiments may include a circular shape, a triangular shape, a tetragonal shape, and a hexagonal shape, and the semiconductor device 100 may be formed in any other shapes regardless of its size unless such shapes improve the degree of integration of a semiconductor device array.

When a sufficient current is secured in the semiconductor device, a plurality of devices may be formed by using one source electrode. The plurality of semiconductor devices sharing one source electrode are to be described below.

Figure 4:
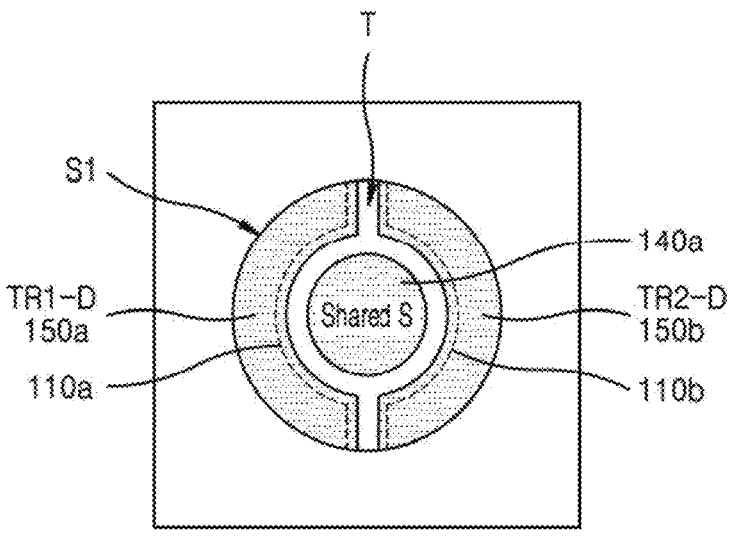
FIGS. 4 and 5 are plan views of a semiconductor device according to some example embodiments.

FIG. 4 is a diagram of a semiconductor device operated by two transistors according to some example embodiments.

The semiconductor device may include a first gate electrode 110a and a second gate electrode 110b which are spaced apart from each other with a trench arranged therebetween, a gate insulating layer formed in the trench and an upper surface S1 of a substrate, a channel layer arranged on the gate insulating layer, a source electrode arranged in the trench, a first drain electrode 150a and a second drain electrode 150b, which are arranged apart from each other on the upper surface of the substrate.

The first gate electrode 110a, the channel layer, the source electrode, and the first drain electrode 150a may operate as a first transistor, and the second gate electrode 110b, the channel layer, the source electrode, and the second drain electrode 150b may operate as a second transistor.

Although FIG. 4 illustrates two gate electrodes and two drain electrodes, the semiconductor device may include two or more gate electrodes and two or more drain electrodes.

Figure 5:
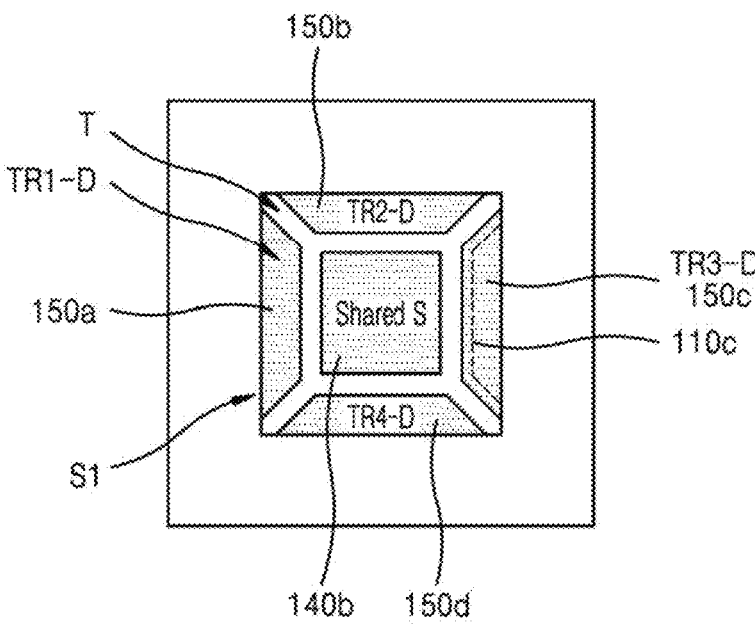

FIG. 5 is a diagram of a semiconductor device operated by four transistors according to some example embodiments.

With reference to FIGS. 4 and 5, the drain electrode 150 of the semiconductor device 100 according to some example embodiments may include the first drain electrode 150a and the second drain electrode 150b spaced apart from each other which the trench arranged therebetween. The first drain electrode 150a and the second drain electrode 150b are used to describe a plurality drain electrodes, and the drain electrode 150 may further include a third drain electrode 150c, a fourth drain electrode 150d, etc.

That is, a plurality of drain electrodes (150a, 150b, 150c, and 150d) may be connected with one source electrode 140. As there is no need to form a separate drain electrode to correspond to a separate source electrode, a highly integrated semiconductor device may be manufactured. Moreover, a plurality of channel layers may be formed to connect the plurality of drain electrodes (150a, 150b, 150c, and 150d) with one trench, and a plurality of semiconductor devices may be formed. A semiconductor device with a higher density per unit area may be formed.

Given to the structural characteristics of the semiconductor device, the gate electrode connecting the source electrode with the drain electrode is required. As illustrated in FIGS. 4 and 5, when the plurality of drain electrodes are connected with one source electrode, a plurality of gate electrodes (110a, 110b, and 110c) may be formed in correspondence thereto.

That is, the first gate electrode 110a and the second gate electrode 110b arranged to connect the first drain electrode 150a to the second drain electrode 150b sharing a first source electrode 140a. Moreover, the third gate electrode 110c and the fourth gate electrode (not shown) arranged to connect the third drain electrode 150c to the fourth drain electrode 150d sharing a second source electrode 140b. However, the foregoing is only an example, and the inventive concepts are not limited thereto.

Therefore, as shown in FIGS. 4 and 5, the plurality of drain electrodes (e.g., 150a-150b in FIG. 4) may be on separate, respective areas of the upper surface S1 of the substrate S that at least partially overlap separate, respective gate electrodes (e.g., 110a-110b in FIG. 4) in a vertical direction extending perpendicular to the upper surface S1 of the substrate S (e.g., in FIG. 4, in the direction extending out/into the illustration).

As described above, a plurality of drain electrodes may be connected with one source electrode in the semiconductor device 100 according to some example embodiments. Due to such structural characteristics, the semiconductor device may have a higher density and a higher degree of integration compared to the existing semiconductor devices.

One source electrode (140a, 140b) may be connected with one drain electrode, two drain electrodes (150a and 150b), or four drain electrodes (150a, 150b, 150c, and 150d). However, this is just an example, and a plurality of semiconductor devices including a plurality of drain electrodes may be formed in various forms.

Figure 6:
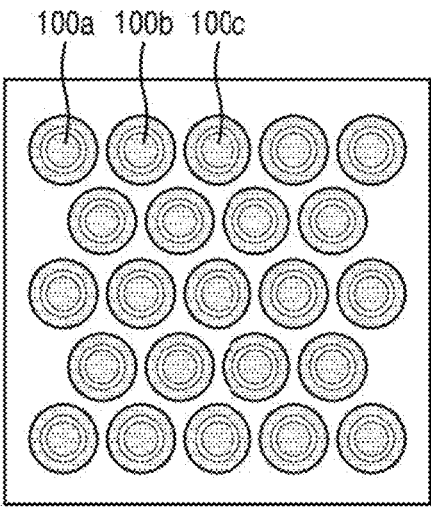
FIG. 6 is a diagram of a semiconductor apparatus including a plurality of semiconductor devices according to some example embodiments.

FIG. 6 is a diagram of a semiconductor apparatus including a plurality of semiconductor devices according to some example embodiments.

With reference to FIG. 6, a plurality of semiconductor devices (100a, 100b, and 100c) may be formed in a structure having the highest density per unit area. The plurality of semiconductors (100a, 100b, and 100c) illustrated in FIG. 6 have the structure that one drain electrode corresponds to one source electrode; however, this is just an example, and a plurality of semiconductor devices in which a plurality of drain electrodes correspond to one source electrode may be formed in a structure having the highest density per unit area.

According to the structure of the semiconductor device 100 according to some example embodiments, as a portion occupied by the channel layer 130 in the horizontal direction of the semiconductor device 100 is low regardless of the length of the channel layer 130, the semiconductor device 100 may have a high degree of integration, and when the plurality of semiconductor devices are manufactured in an integrated manner based on the autonomy of the semiconductor device according to some example embodiments, it may be possible to design a semiconductor device having the highest density.

The shape of the semiconductor device 100 according to some example embodiments may include a circular shape, a triangular shape, a tetragonal shape, and a hexagonal shape; however, the inventive concepts are not limited thereto, and the semiconductor device 100 may be formed in any other shapes regardless of its size unless such shapes improve the degree of integration of a semiconductor device. For example, the semiconductor device may be formed in a pentagonal shape, a hexagonal shape, or an octagonal shape.

Figure 7:
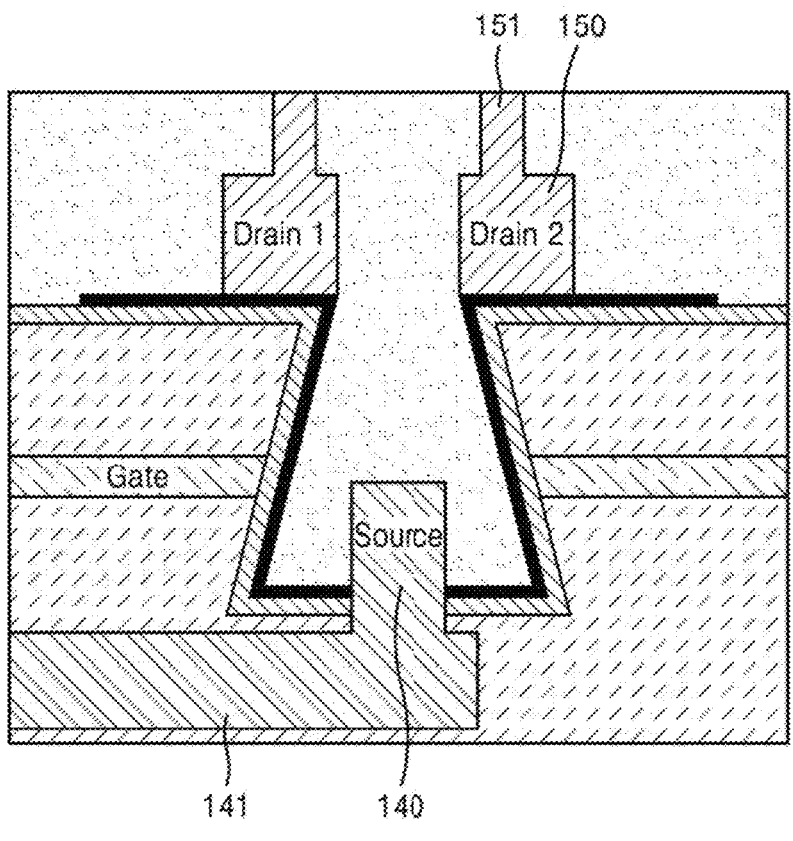
FIG. 7 is a diagram illustrating an example of an actual method of forming an electrode of a semiconductor device, according to some example embodiments.

With reference to FIG. 7, a metal lead 141 (e.g., metal wire) may be arranged at the bottom of the source electrode 140, and a metal lead 151 may be arranged at the top of the drain electrode 150. An actual method of forming the source electrode 140 may include forming the metal lead 141 at the bottom before forming a hole by using a photolithography process, etching the 2D semiconductor material by using an ion beam process and a biased dry etching process while a certain insulating material and the 2D semiconductor material are deposited, and then depositing the source electrode 140.

FIG. 7 is a diagram illustrating an example of a method of forming an electrode of a semiconductor device, according to some example embodiments.

With reference to FIG. 7, a metal wire (e.g., metal lead) may be arranged at the bottom the source electrode 140, and a metal wire may be arranged at the top of the drain electrode 150. An actual method of forming the source electrode 140 may include forming the metal wire at the bottom before forming a hole by using a photolithography process, etching the 2D semiconductor material by using an ion beam process and a biased dry etching process while a certain insulating material and the 2D semiconductor material are deposited, and then depositing the source electrode 140. However, the inventive concepts are not limited thereto.

The semiconductor device described above may be employed in various electronic devices. The semiconductor devices may be used as a logic transistor or a memory transistor.

The semiconductor device may be used as a memory cell, a plurality of memory cells may be arranged in a 2D manner, in the vertical or horizontal direction, or in one direction to form a memory string cell, and then a plurality of memory string cells may be formed in a 2D manner, etc. to constitute a memory cell array.

The semiconductor device may be a part of an electronic circuit constituting an electronic device with other circuit elements, such as a capacitor, etc.

Figure 8:
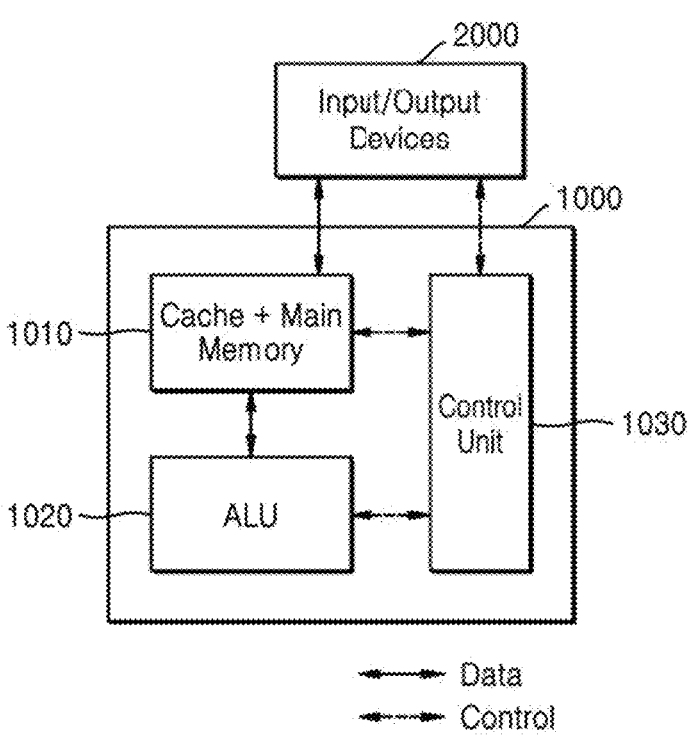
FIGS. 8 and 9 are conceptual diagrams schematically illustrating a device architecture applicable to an electronic device according to some example embodiments.
Figure 9:
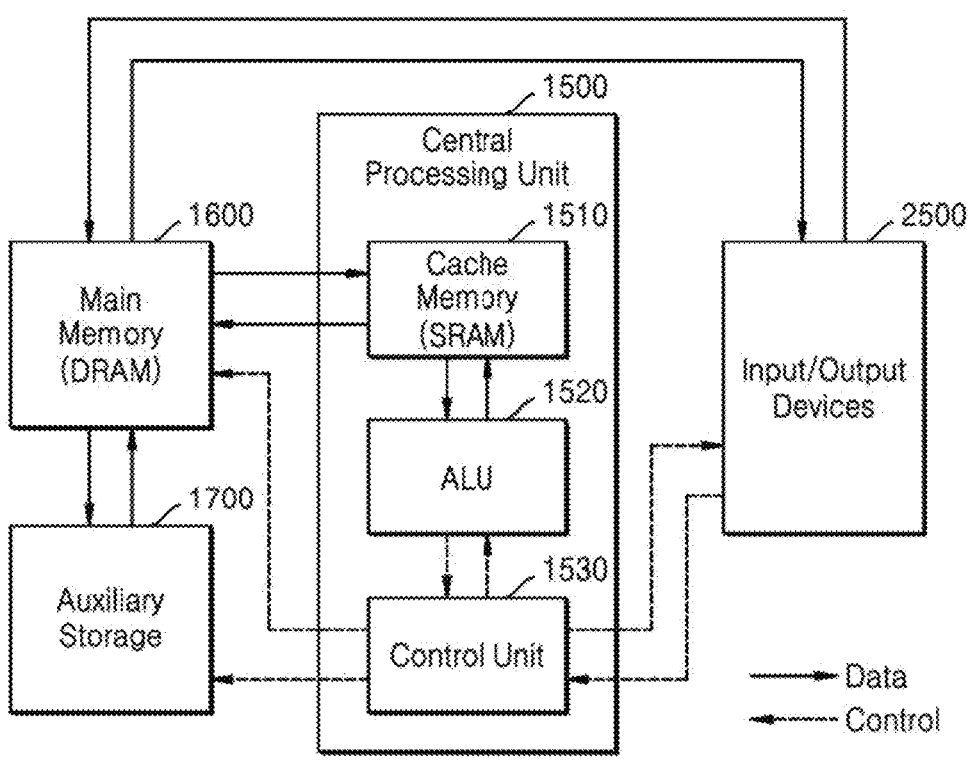

FIGS. 8 and 9 are conceptual diagrams schematically illustrating a device architecture applicable to an electronic device according to some example embodiments.

With reference to FIG. 8, an electronic device architecture 1000 may include a memory unit 1010 and a control unit 1030, and further include an arithmetic logic unit (ALU) 1020. The memory unit 1010, the ALU 1020, and the control unit 1030 may be electrically connected to one another. For example, the electronic device architecture 1000 may be implemented as a single chip including the memory unit 1010, the ALU 1020, and the control unit 1030. Specifically, the memory unit 1010, the ALU 1020, and the control unit 1030 may be interconnected by a metal line on an on-chip and communicate directly with each other. The memory unit 1010, the ALU 1020, and the control unit 1030 may be integrated on one substrate in a monolithic manner and constitute a single chip. Input/output devices 2000 may be connected to the electronic device architecture (chip) 1000. The memory unit 1010 may include both of a main memory and a cache memory. Such electronic device architecture (chip) 1000 may be an on-chip memory processing unit.

The memory unit 1010, the ALU 1020, and/or the control unit 1030 may each independently include the semiconductor device including the trench described above. Such an electronic device may be a logic transistor, a memory transistor, or a switching transistor.

With reference to FIG. 9, a cache memory 1510, an ALU 1520, and a control unit 1530 may constitute a central processing unit (CPU) 1500, and the cache memory 1510 may include static random access memory (SRAM). Separate from the CPU 1500, a main memory 1600 and an auxiliary storage 1700 may be provided, and an input/output device 2500 may also be provided. The main memory 1600 may be dynamic random access memory (DRAM) and may include an electronic device using an anti-ferrodielectric thin film structure described above, for example, a capacitor. However, the inventive concepts are not limited thereto.

In some cases, the electronic device architecture may be implemented in a form in which computing unit elements and memory unit elements are adjacent to each other on a single chip without separating sub-units.

As described herein, any devices, systems, modules, units, controllers, circuits, architectures, and/or portions thereof according to any of the example embodiments (including, without limitation, semiconductor device 100, electronic device architecture 1000, memory unit 1010, ALU 1020, control unit 1030, input/output devices 2000, CPU 1500, cache memory 1510, ALU 1520, control unit 1530, main memory 1600, auxiliary storage 1700, input/output device 2500, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

Any of the memories, memory units, memory chips, storages, storage devices, or the like as described herein may be a non-transitory computer readable medium and may store a program of instructions. Any of the memories, memory units, memory chips, storages, storage devices, or the like described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Although a semiconductor device and a method of manufacturing the semiconductor device are described referring to the drawings, such descriptions are merely an example, and a person skilled in the art may understand that various modifications and equivalent embodiments can be made from the provided description. Thus, the embodiments should be considered in a descriptive sense and not for purposes of limitation. The scope of the inventive concepts are defined not by the detailed description of example embodiments but by the appended claims, and all differences within the scope will be construed as being included in the scope of the inventive concepts.

As the semiconductor device includes the channel layer including the 2D semiconductor material and the trench structure having a gradient, the length of the channel layer may be reduced, which leads to a higher degree of integration of the semiconductor device. In addition, a plurality of transistors may be formed in one trench by sharing a source electrode, and accordingly, a semiconductor device having a high density may be manufactured.

It should be understood that example embodiments described herein should be considered in a descriptive sense only and not for purposes of limitation. Descriptions of features or aspects within each example embodiment should typically be considered as available for other similar features or aspects in other example embodiments. While some example embodiments have been described with reference to the figures, it will be understood by those of ordinary skill in the art that various changes in form and details may be made therein without departing from the spirit and scope as defined by the following claims.

What is claimed is:

1. A semiconductor device, comprising:
a substrate including a gate electrode therein, one or more inner surfaces of the substrate at least partially defining a trench penetrating the gate electrode and in the substrate;
a gate insulating layer that is both in the trench and on an upper surface of the substrate;
a channel layer on the gate insulating layer, the channel layer including a two-dimensional (2D) semiconductor material; and
a source electrode and a drain electrode, which are spaced apart from each other on the channel layer.

2. The semiconductor device of claim 1, wherein a width in a horizontal direction of an upper area of the trench that is proximate to the upper surface of the substrate is different from a width in the horizontal direction of a lower area of the trench that is distal from the upper surface of the substrate, the horizontal direction extending parallel to the upper surface of the substrate.

3. The semiconductor device of claim 1, wherein a width of the trench in a horizontal direction extending parallel to the upper surface of the substrate continuously changes from a first width proximate to the upper surface of the substrate towards a second width proximate to an interior of the substrate in a vertical direction extending perpendicular to the upper surface of the substrate.

4. The semiconductor device of claim 1, wherein a width of the trench in a horizontal direction extending parallel to the upper surface of the substrate continuously increases from a first width proximate to the upper surface of the substrate towards a second width proximate to an interior of the substrate in a vertical direction extending perpendicular to the upper surface of the substrate.

5. The semiconductor device of claim 1, wherein an inclination angle of a wall of the trench to a central axis of the semiconductor device is greater than 0° and less than or equal to 45°.

6. The semiconductor device of claim 1, wherein the source electrode is in the trench, and the drain electrode is on the upper surface of the substrate.

7. The semiconductor device of claim 1, wherein a distance between the source electrode and the drain electrode in a horizontal direction parallel to the upper surface of the substrate is smaller than a distance between the source electrode and the gate electrode in the horizontal direction.

8. The semiconductor device of claim 1, wherein a distance between the source electrode and the drain electrode in a horizontal direction parallel to the upper surface of the substrate is 0 nm.

9. The semiconductor device of claim 1, wherein at least one of the source electrode or the drain electrode has a central axis that is coaxial with a central axis of the semiconductor device so as to be symmetric with respect to the central axis of the semiconductor device.

10. The semiconductor device of claim 1, wherein
the gate electrode comprises a first gate electrode and a second gate electrode, which are spaced apart from each other, and
the drain electrode comprises a first drain electrode and a second drain electrode, which are on separate, respective areas of the upper surface of the substrate that at least partially overlap separate, respective ones of the first gate electrode and the second gate electrode in a vertical direction extending perpendicular to the upper surface of the substrate.

11. The semiconductor device of claim 1, wherein the 2D semiconductor material includes transition metal dichalcogenide (TMD).

12. The semiconductor device of claim 11, wherein the TMD includes
a metallic element selected from Mo, W, Nb, V, Ta, Ti, Zr, Hf, Tc, Re, Cu, Ga, In, Sn, Ge, and Pb, and
a chalcogen element selected from S, Se, and Te.

13. The semiconductor device of claim 1, wherein the gate electrode includes at least one of graphene, amorphous carbon, Cu, Au, Ag, Mo, W, Ti, Al, Co, Ru, TiN, or indium tin oxide.

14. A method of manufacturing a semiconductor device, the method comprising:
preparing a substrate including a gate electrode therein;
forming, in the substrate, a trench at least partially defined by one or more inner surfaces of the substrate such that the trench penetrates the gate electrode;
forming a gate insulating layer that is both in the trench and on an upper surface of the substrate;
forming, on the gate insulating layer, a channel layer including a two-dimensional (2D) semiconductor material; and
forming a source electrode and a drain electrode that are spaced apart from each other on the channel layer.

15. The method of claim 14, wherein the channel layer is formed based on using a vapor deposition process.

16. The method of claim 15, wherein the vapor deposition process includes at least one of metal organic chemical vapor deposition (MOCVD), thermal chemical vapor deposition (TCVD), plasma enhanced chemical vapor deposition (PECVD), or atomic layer deposition (ALD).

17. The method of claim 14, wherein an inclination angle of a wall of the trench to a central axis of the semiconductor device is greater than 0° and less than or equal to 45°.

18. The method of claim 14, wherein the source electrode and the drain electrode are formed based on using physical vapor deposition (PVD).

19. The method of claim 14, wherein a width in a horizontal direction of an upper area of the trench that is proximate to the upper surface of the substrate is different from a width in the horizontal direction of a lower area of the trench that is distal from the upper surface of the substrate, the horizontal direction extending parallel to the upper surface of the substrate.

20. The method of claim 14, wherein the 2D semiconductor material includes transition metal dichalcogenide (TMD).

* * * * *